United States Patent [19]

Varadarajan

[11] Patent Number: 4,547,881
[45] Date of Patent: Oct. 15, 1985

[54] ECL LOGIC CIRCUIT WITH A CIRCUIT FOR DYNAMICALLY SWITCHABLE LOW DROP CURRENT SOURCE

[75] Inventor: Hemmige D. Varadarajan, Sunnyvale, Calif.

[73] Assignee: Advanced Micro Devices, Inc., Sunnyvale, Calif.

[21] Appl. No.: 550,529

[22] Filed: Nov. 9, 1983

[51] Int. Cl.[4] .......................................... H03K 19/086
[52] U.S. Cl. ................................. 307/296 R; 307/270; 307/455
[58] Field of Search ................... 307/454–456, 307/270, 296 R, 297; 330/258; 323/312–316

[56] References Cited

U.S. PATENT DOCUMENTS

| | | | |
|---|---|---|---|
| 3,848,143 | 11/1974 | Millington et al. | 307/297 |
| 4,059,793 | 11/1977 | Ahmed | 307/297 X |
| 4,189,617 | 2/1980 | Yuen | 323/314 |
| 4,249,091 | 2/1981 | Yamagiwa | 307/455 |
| 4,283,641 | 8/1981 | Skingley | 307/296 R X |
| 4,329,597 | 5/1982 | Yamagiwa | 307/455 |
| 4,339,707 | 7/1982 | Gorecki | 323/313 |
| 4,362,984 | 12/1982 | Holland | 323/313 |

FOREIGN PATENT DOCUMENTS 1463698  8/1969  Fed. Rep. of Germany ...... 307/297

OTHER PUBLICATIONS

Seelbach, "Emitter Coupled Logic", Integrated Circuits Applications Handbook, published by Wiley, 1983, pp. 57–94.
Seidman, Integrated Circuits Applications Handbook, published by Wiley, 1983, pp. 498–499.

Primary Examiner—Stanley D. Miller
Assistant Examiner—D. R. Hudspeth
Attorney, Agent, or Firm—Patrick T. King; J. Vincent Tortolano; Warren M. Becker

[57] ABSTRACT

An ECL circuit with a bias circuit is provided which tracks the gain and operating characteristics of other transistors in an integrated circuit. The bias circuit employs the bandgap reference voltage, $V_{CS}$, as the power source. By a transistor and resistor network a bias circuit voltage is generated. The bias circuit is useful in providing a bias to the base of a dynamically switchable low drop current source useful in ECL circuits.

16 Claims, 6 Drawing Figures

ECL LOGIC CIRCUIT WITH A CIRCUIT FOR DYNAMICALLY SWITCHABLE LOW DROP CURRENT SOURCE

BACKGROUND OF THE INVENTION

1. Technical Field

This invention relates to an ECL logic circuit with a bias circuit for use in an integrated circuit and, more particularly, relates to an ECL logic circuit with a bias circuit which utilizes a reference voltage available on-chip, tracks the gain and operating characteristics of other transistors in an integrated circuit and permits the operation of a dynamically switchable low drop current source.

2. Discussion of Background and Prior Art

As the level of integration has increased for integrated circuits, limiting factors for density and performance have arisen both in processing and in circuit design. With processing, minimum achievable line widths and minimum layer thicknesses have limited density. With circuit design, the availability of a preferred logic family for a particular application, the number of logic levels that can be used and power consumption have been limiting factors. Generally, it is desirable to be able to use logic families which have the lowest speed-power products and therefore the shortest propagation delay, to employ multiple logic levels, to be able to operate devices with minimal power and to operate circuits within specified limits of performance over various temperature ranges and to utilize circuits within specified limits of performance which have been fabricated on various parts of a silicon wafer.

Emitter coupled logic is a preferred logic family. It is used in high-speed data processing, for digital communication and in test equipment. ECL offers the lowest delays of any logic family. For a discussion of the advantages and design principles applicable to ECL devices, see, e.g. W.C. Seelbach, "Emitter Coupled Logic" in *Integrated Circuits Applications Handbook*, Chapter 3 (1983). It is desirable to fabricate circuits based on ECL logic, especially bias circuits which impact many other subcircuits with a specified performance even as operating temperature changes and even for circuits which come from different batches of silicon wafer processing.

Conventional ECL gate circuits utilize current sources which have a large resistor in their emitter circuit. This resistor absorbs a voltage drop of nearly 800 mv since it carries the same current which flows through the resistor attached to the base of the emitter follower that produces the low to high transistion on the output line. As a consequence of the high voltage drop there is a loss of the number of levels of ECL logic which are usable with conventional power supplies, since each logic level requires a minimum fixed voltage drop. In the alternative, power supplies of higher voltage than desirable are required to operate the number of specified ECL logic levels. In addition, the voltage drop in the resistor located in the emitter circuit dissipates power. Also, the inability to control the current $i_L$, in the load current source, is a detriment for fast circuits. This results from the fact that the presence of the large resistor in the emitter circuit produces DC and AC degeneration which works against any attempt to dynamically raise or lower the value of the current. Thus, the performance of ECL gate circuits could be enhanced if the current sources could be driven by means which did not require a high value resistor between the emitter and ground.

Bias circuits are typically structured on-chip as diode and resistor strings which divide externally applied voltages. Or they are complex circuits with temperature and process compensation which provide, for example, the bandgap reference voltage, $V_{CS}$. It would be desirable to have a bias circuit which produces a stable bias voltage which was temperature and process compensated which was simple and derived its power and characteristics from available reference voltages.

It is therefore an object of the present invention to provide an ECL circuit with a bias circuit which produces a bias voltage which may produce a stable current source over operating temperature.

It is another object of the present invention to provide an ECL circuit with a bias circuit which produces a stable current source wherever the circuit is fabricated on a wafer and for any application at any location within a circuit.

It is another object of the present invention to provide a bias circuit and current source combination which has low voltage drop so that it is suitable for incorporation in high speed, multiple level ECL gate circuits.

It is a further object of the present invention to provide a bias circuit and current source combination which is susceptible to being driven dynamically.

BRIEF DESCRIPTION OF THE DRAWINGS

For a more complete understanding of the present invention, reference may be had to the accompanying drawings which are incorporated herein by reference and in which:

FIG. 2b is a current source for use, e.g., in an ECL logic circuit shown to be controlled by the bias circuit of FIG. 2a;

FIG. 3 is an alternate current source capable of being controlled by the bias circuit of FIG. 2a;

SUMMARY OF THE INVENTION

An ECL circuit with a bias circuit is provided which tracks the gain and operating characteristics of other transistors in an integrated circuit. The bias circuit employs the bandgap generated reference voltage, $V_{CS}$, as the power source. Therefore, the bias generated tracks with $V_{BE}$ and temperature as does $V_{CS}$. The bias circuit is useful in providing a bias to the base of a dynamically switchable low drop current source useful in ECL circuits. In a preferred embodiment, the bias circuit comprises a transistor having the same size as current source transistor for which a bias is provided so that changes in $\beta$ due to process variations and changes in operating characteristics due to variations in temperature will track. In addition, the bias circuit is preferably fabricated close to the current source transistor so that there are no appreciable device-to-device variations in performance. The bias circuit comprises a bipolar transistor whose collector is connected through two series-connected resistors to $V_{CS}$. The emitter is coupled to ground. The base is coupled through a third resistor to the dividing point between the first two resistors. The generated bias voltage $V_{CSL}$ is available on the collector of the transistor. In a preferred embodiment the third resistor is selected to be of the same size as the resistor on the base of the current source transistor.

DESCRIPTION OF THE PREFERRED EMBODIMENTS

Figure 1:
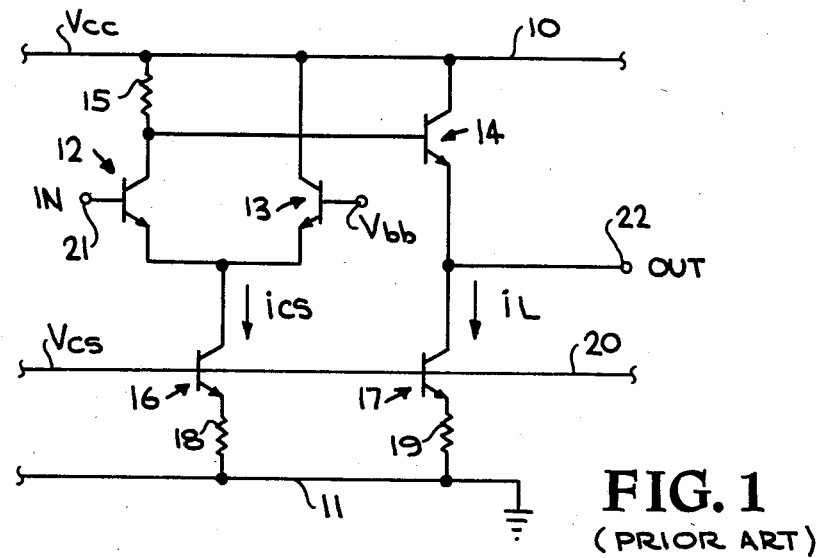
FIG. 1 is a simplified circuit schematic of a typical ECL gate circuit of the prior art.

In FIG. 1 a simplified schematic of a typical NOR ECL gate is shown. For more detailed discussions see, e.g., *Integrated Circuits: Design Principles and Fabrication*, R. N. Warner, Jr., ed. McGraw-Hill (1965), Sec. 5-10, pp. 156-159. Input transistor 12 is representative of the several input transistors typically found in an OR/NOR array. In operation, when a high input is received on terminal 21 on the base of transistor 12, current flows through resistor 15 from the positive supply $V_{CC}$ on line 10 through transistor 12. This diverts current which previously had been passing through transistor 13 which is controlled by a reference voltage $V_{BB}$. In practice the reference voltage $V_{BB}$ will be midway between the maximum available voltage level for a logic one and the minimum available voltage level for a logic zero on the output 22 of emitter follower output transistor 14. This will permit a clearcut logic swing as the current $i_{CS}$ passing between voltage rails 10 and 11 is switched between transistors 12 and 13 as a function of the instantaneous input voltage on terminal 21. Transistor 16 is controlled by the bandgap generated reference voltage level $V_{CS}$ as is load current source transistor 17. This bandgap reference is the conventional voltage reference available on ECL chips. See A. H. Seidman, *Integrated Circuits Applications Handbook*, pp. 498-499 (1983). It is a stable reference voltage which tracks the $V_{BE}$ characteristics of transistors on the ECL chip. The current through current source transistor 17, as described above, is designated $i_L$ and effectively determines the current through emitter follower output transistor 14. The magnitude of this current $i_L$ cannot be dynamically controlled in this prior art scheme because of the high degeneration caused by resistor 19. Resistor 19 produces both DC and AC degeneration, thus preventing any attempt to raise or lower the current value dynamically. This results from the fact that any transient voltage applied to the base of transistor 17 will appear across resistor 19. And since the change in the collector current is inversely proportional to the value of resistor 19, the smaller the value of resistor 19, the greater the effect of a transient voltage on the base of transistor 17.

Every integrated circuit contains both on-chip power supplies and voltage references. Typically, a positive supply $V_{CC}$ will be specified as providing a voltage at a certain level. Specifications are typically not extremely tight since it is realized that power may be supplied intermittently and transients may occur. On the other hand, on-chip reference voltages are typically specified to within narrow ranges. Thus, the bandgap reference voltage, $V_{CS}$, and the ECL intermediate reference level $V_{BB}$ typically should be generated within narrow ranges. It is highly desirable as well that such bias voltages track the characteristics of the devices with which they are associated both as variations in processing occur and over variations in temperature. In ECL circuits of the prior art, simple diode and resistor combinations have been used as bias sources for the base of current sources. Such schemes have universally provided poor performance. The bias circuit of the present invention is shown in FIG. 2a.

Figure 2A:
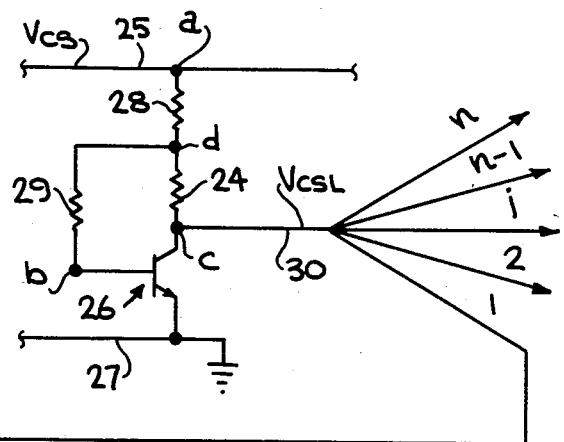
FIG. 2a is a circuit schematic of the bias circuit of the present invention.

In FIG. 2a the bias circuit is shown to produce a bias voltage $V_{CSL}$ on line 30 which is available to fan out on lines 1, 2, i, n−1, and n to control the bases of current source transistors used with individual ECL gates. The bias voltage $V_{CSL}$ with track the characteristics of associated current source transistors over a wide range of variations in process dependent parameters such as $\beta$ and variations in operating parameters such as temperature providing the size of transistor 26 is comparable to the size of the associated current source transistors. For ECL, for example, it is well known that the transition width of an ECL gate is given by $$T_W = \frac{2kT}{q} \ln \alpha$$

where
$T_W$ = transition width
$T$ = temperature in °K
$k$ = Boltzmann's constant
$q$ = electronic charge
$\alpha = 0.8 q/kT$ so operation varies with temperature. The maintenance of a not too widely varying value for $V_{CSL}$ happens for $\beta$s ranging from 50 to 150 and for temperatures over the military specification range of −55° C. to +155° C. Since the emitter of current source transistor 33 is grounded the transistor remains a relatively constant current source even at low voltage drops. Dynamic control of conduction through current source transistor 33 is accomplished by a switching signal applied on terminal 36 and capacitively coupled through capacitor 34. This signal may be supplied by any source or may be supplied from complementary logic levels in an ECL gate as described in U.S. patent application Ser. No. 06/550,528, filed Nov. 9, 1983 by H. D. Varadarajan for "High Speed ECL Circuit Adapted to Drive Loads Having Significant Capacitance".

In virtually all ECL logic circuits there is available at least one stable voltage reference source generated on-chip. The bias circuit of the present invention which is suitable for regulating current sources uses such a stable reference voltage and transforms it into a voltage suitable for regulating a large number of current sources. Thus, as shown in FIG. 2a the bandgap reference voltage $V_{CS}$ is supplied on line 25 to node a. This voltage is divided across resistors 28 and 24 and provided to the collector of transistor 26. As a result of the division there is an intermediate potential available on node d and another potential available on node c, the collector of transistor 26. The potential on node c is supplied on line 30 as the output $V_{CSL}$, a bias voltage which will be used, for example, to establish a bias on the base of an associated current source transistor 33 through resistor 32 on which a switching signal is impressed. The level of this bias should be such that regardless of process-dependent or operation-dependent variations the current source transistor passes the appropriate amount of DC current. Dynamically increasing this current enables fast pulldown of the output line in a downgoing transition while decreasing this current enables the output line to be pulled up faster in an upgoing transition.

Figure 4:
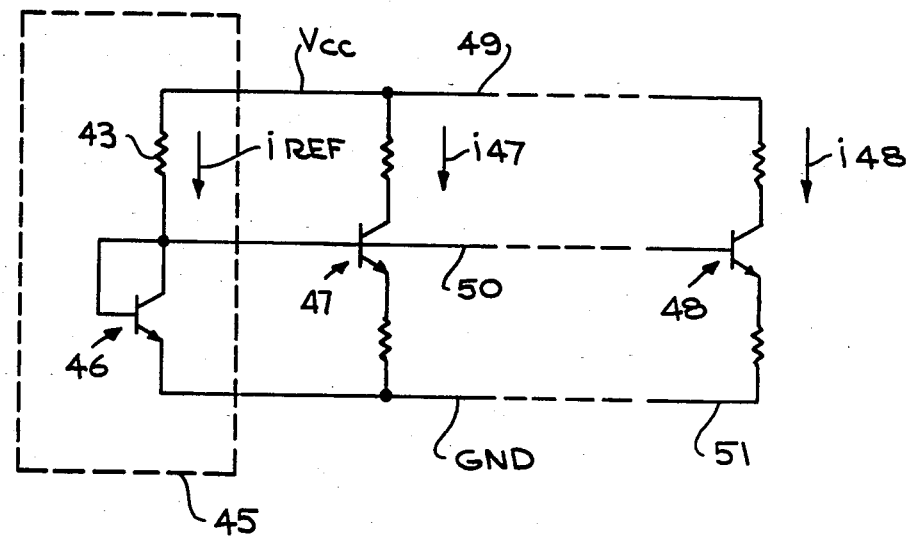
FIG. 4 is a circuit schematic of a prior art current mirror type current source.

All logic circuits require current sources. A common current source of the prior art is the current mirror depicted in FIG. 4. The current $i_{REF}$ is generated through reference transistor 46 by selecting the value for resistor 49 and by specifying the value of $V_{CC}$ power bus 49. The current generated within dotted line 45, i.e. $i_{REF}$, is mirrored through transistors 47, 48 and any other transistors connected to the common base line 50, common collector line 49 ($V_{CC}$) and the common ground line 51. Thus, $i_{REF} = i_{47} = i_{48}$. Such current mirrors do not produce currents with sufficiently tight tolerances unless all devices are fabricated close together. Also, when $V_{CC}$ varies over its allowable range, e.g. over a range of 10% in value, a simple current mirror arrangement produces variations in the current through each of the attached current sources. For most applications, however, it is desirable to have current sources which are well defined over variations in fabrication and operation. For example, variations of 10% in $V_{CC}$ may produce a sources may be produced by use of the bias circuit of the present invention, as described subsequently.

Generally, it is desirable that a small voltage drop occur across a current source so as to economize on power, to reduce heating effects and to allow multiple logic levels to be used. Since ECL logic devices have the shortest propagation delay, the degradation of performance due to non-optimum current sources is realized most severely with ECL gate circuits. The conventional current source for ECL circuits is shown in the prior art of FIG. 1. Here, the load current $i_L$ is drawn through transistor 17 and resistor 19 to ground. This current flows continuously and produces the high-to-low transition on OR output line 22 when the base of emitter follower 14 is pulled down. A large value resistor 19 is employed and has a drop of 700 mv as does resistor 18 so that a 700 mv drop will be produced across resistor 15. This is required because of the relationship between a voltage drop across resistor 15 and the logic swing on output 22 whereby a 700 mv drop or more on resistor 15 will produce a similar 700 mv logic swing on the output. Thus, the value for the bandgap reference on the base of current source transistor 17 is chosen so that the voltage drop across resistors 18 and 19 are each approximately 700 mv. There is thus entailed an allocation of significant voltage to the two resistors 18 and 19. If, for example, the value of resistor 19 were reduced, the voltage drop would stay the same but the current would increase. In that case heating losses which are proportional to I²R would increase and be undesirable.

Figure 2B:
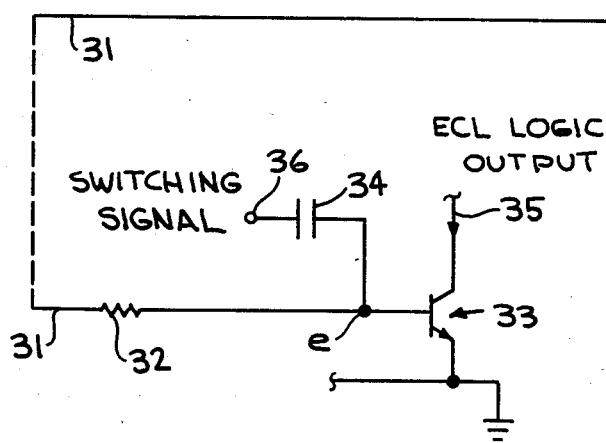
Figure 3:
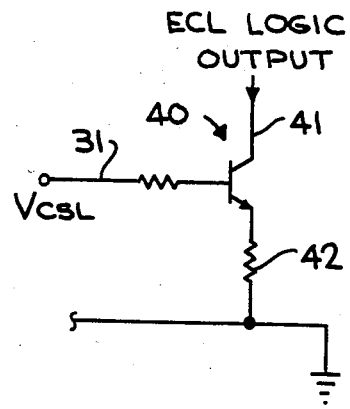

It is desired that a single bias circuit provide a bias for as many current source transistors 33 as possible. The fanout is shown as lines 1, 2, i, n—1, n. It has been found that this circuit can be designed for any fanout of known value. For a fanout of 50–100 the bias circuit consumes 0.5 ma of power. When the bias circuit of FIG. 2a is used to control the current source transistor 33 of FIG. 2b, it has been found that a current stable to ±2% may be obtained for a $\beta$ range of 50 to 150 for the transistors. Since the temperature and $V_{BE}$ variations have been compensated for in the $V_{CS}$ supply from line 25 the bias circuit is also compensated. Because of isolating resistor 32 a dynamically switchable current source is obtainable in which a logic signal may be directly impressed on the base of the load current source transistor. Faster logic circuits are thus attained.

In order to obtain a relatively constant $i_L$ for varying $\beta$ and to fanout to $F_0$ current sources, the current required from $V_{CSL}$ is given by:

$$i_{CSL} = \frac{F_0 \cdot I_L}{\beta}$$

Since $\beta$ varies over a range of $\beta_{min}$ to $\beta_{max}$, the largest current demanded is:

$$i_{CSLmax} = \frac{F_0 \cdot I_L}{\beta_{min}}$$

In order to supply this maximum current, it is typically the case that a margin of safety is supplied, thus a constant current $k \times I_{CSLmax}$ would typically be supplied. Now, since resistor 32 has a relatively large value, i.e. 40 k ohms, in order to isolate the base of transistor 33 for purposes of AC coupling, the drop across resistor 32 is given by:

$$V_{32} = \frac{i_L \cdot R_{32}}{\beta_{min}}$$

Now, in the preferred embodiment since transistors 26 and 33 are fabricated close together and are of the same physical size, the $\beta$ will be constant over the range of currents carried in transistors 26 and 33 and will be equal for the two devices. And, since $$R_{29} = \frac{R_{32}}{k}$$

the node d has a potential:

$$V_d = V_{BE26} + V_{32}$$

Thus, $R_{28}$ has a value of:

$$R_{28} = \frac{V_{CS} - (V_{BE26} + V_{32})}{k \cdot i_L \left(1 + \frac{1}{\beta}\right) + (F_0 \cdot i_{CSLmax})}$$

Since the base to emitter voltages in transistors 26 and 33 are different by design, i.e. the transistor 26 must have a current which will allow it to supply $V_{CSL}$ to as many lines as are in the fan, the value for resistor 24 is given as:

$$R_{24} = \frac{V_{BE26} - V_{BE33}}{k \cdot (i_L) + (F_0 \cdot i_{CSLmax})}$$

When the values given above are chosen, $i_L$ will be held constant over a wide range of $\beta$ such as 50–150 to within a few percent due to chip tracking of resistor values and transistor parameters.

Simulation data for a nominal $i_L$ of 100 $\mu$A for different $\beta$s and temperatures is given in Table I below. The values for the resistors have been chosen as $R_1 = 1.3$ k, $R_2 = 10$ k, $R_3 = 120$ and $R_4 = 40$ k. Transistors 26 and 33 are specified as of the same size having emitters of 28 square microns:

TABLE I

| Temperature | $V_{CS}$ | $I_L$ for $\beta = 50$ | $I_L$ for $\beta = 100$ | $I_L$ for $\beta = 150$ |
|---|---|---|---|---|
| 25° C. | 1.53 V | 98 μA | 105 μA | 102 μA |
| 155° C. | 1.278 V | 103 μA | 114 μA | 118 μA |
| −55° C. | 1.720 V | 73 μA | 93 μA | 97 μA |

In a preferred embodiment greater accuracy is obtained by trimming resistor 24 to a precise value using DC simulation to produce the optimum current over the range of variations.

Figure 5:
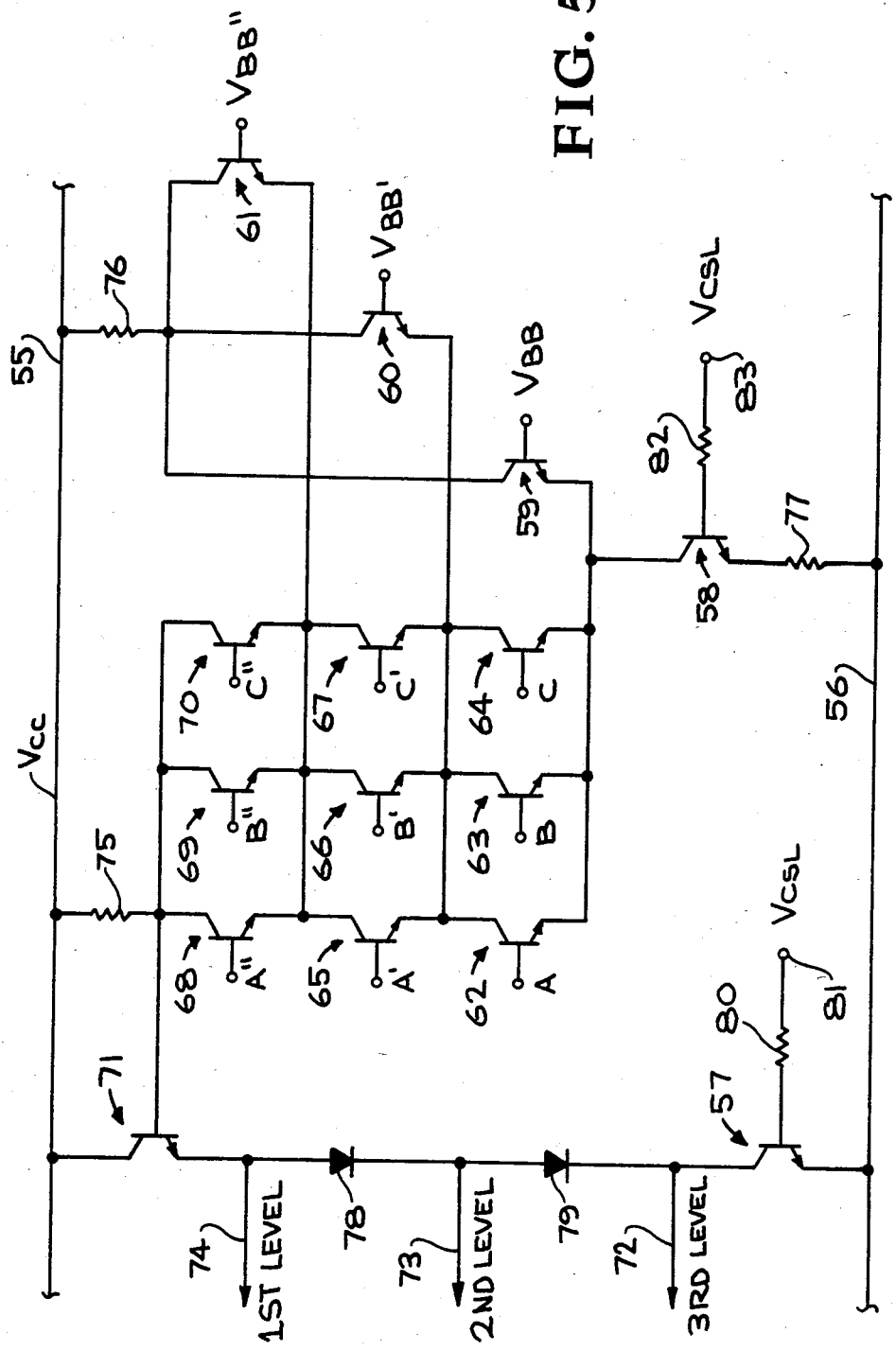
FIG. 5 is a circuit schematic of an ECL logic gate having three level logic and incorporating two current sources controlled by the bias circuit of the present invention.

The utility of the bias circuit of the present invention is shown in the three level ECL gate of FIG. 5. Here, the bias level produced by the bias circuit is applied on terminal 81 to the base of current source transistor 57. Resistor 80 is supplied, as described above, to produce AC decoupling on the base of current source transistor 57. The operation of the ECL gate is as described with respect to single level logic except that three output levels are available, the first level on line 74 between the collector of emitter follower 71 and diode 78, the second level on line 73 between diodes 78 and 79 and the third level on line 72 between diode 79 and the collector of current source transistor 57. As described previously, the availability of the bias voltage $V_{CSL}$ permits the emitter of current source transistor 57 to be directly coupled to the ground line 56 and permits, if desired, current source transistor 57 to be dynamically controlled; such dynamic control is not explicitly shown in the embodiment of FIG. 5. In addition, the current through the logic stages is shown to be supplied by a supply transistor 58 whose base is also controlled by the bias of voltage $V_{CSL}$ supplied on terminal 83. As a consequence, the value of resistor 77 may be very low and there is a minimal voltage drop across transistor 58 and resistor 77 thereby reserving the majority of the voltage from the $V_{CC}$ supply for the three levels of logic. The logic inputs function as is well known in the ECL art. Thus, input transistors 62, 63 and 64 are controlled by logical inputs A, B and C, respectively, and have an associated reference transistor 59 controlled by $V_{BB}$. Similarly, transistors 65, 66 and 67 are controlled by logic inputs A', B' and C', respectively, and have an associated reference transistor 60 controlled by the reference voltage $V_{BB}'$. Finally, the third level of logic inputs is provided by transistors 68, 69 and 70 controlled by inputs A", B" and C", respectively, and their associated reference transistor 61 controlled by reference voltage $V_{BB}''$. The combined currents through the three reference transistors 59, 60 and 61 pass through resistor 75, main current source transistor 58 and resistor 77. Without the availability of $V_{CSL}$ from the bias circuit of the present invention, it would be required to use a higher value for $V_{CC}$ in order to drive the three levels of logic in the ECL gate.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in yet other embodiments and with various modifications as are suited to the particular use contemplated. It is intended that the scope of the invention be defined by the claims appended hereto.

What is claimed is:

1. An ECL circuit comprising:
  a bipolar transistor having means for coupling its emitter to a low potential which is less than a reference supply potential, $V_{CS}$;
  a first resistor coupled to said reference supply voltage $V_{CS}$;
  a second resistor coupled between said first resistor and the collector of said bipolar transistor;
  a third resistor coupled between the base of said bipolar transistor and the interconnection between said first and said second resistors whereby the collector of said bipolar transistor constitutes a bias voltage supply line, $V_{CSL}$;
  a current source transistor; and
  an emitter follower and wherein said $V_{CSL}$ supply line is coupled to the base of said current source transistor, the collector of said current source transistor is coupled to the emitter of said emitter follower and the emitter of said current source transistor is connected to ground.

2. An ECL circuit in accordance with claim 1 wherein said reference supply voltage $V_{CS}$ is a bandgap reference voltage.

3. An ECL circuit in accordance with claim 2 wherein said low potential is ground potential.

4. An ECL circuit in accordance with claim 1 comprising an isolating resistor connected between said base of said current source transistor and said $V_{CSL}$ supply line.

5. An ECL circuit in accordance with claim 4 wherein said isolating resistor has the same resistance value as said third resistor.

6. An ECL circuit and current source transistor in accordance with claim 4 comprising a means for coupling a signal source to said base of said current source transistor between said isolating resistor and said base for controlling the magnitude of collector current in said current source transistor.

7. An ECL circuit in accordance with claim 6 wherein said signal source is a circuit node having a logic level which is complementary to the signal applied to the base of said emitter follower.

8. An ECL circuit in accordance with claim 7 wherein said signal source coupling means comprises a capacitor coupled between said base and said circuit node.

9. An ECL circuit in accordance with claim 4 wherein said bias voltage supply line may supply further current source transistors in a fan out connection, and wherein the values of said first, second and third resistors are given by $$R_{first} = V_{CS} - \frac{(V_{BE(Bipolar)} + V_{Isolating})}{k \cdot i_L \left(1 + \frac{1}{\beta}\right) + (F_0 \cdot i_{CSLmax})}$$

$$R_{second} = \frac{V_{BE(Bipolar)} - V_{BE(Current\ Source)}}{k \cdot (i_L + (F_0 \cdot i_{CSLmax})}$$

$$R_{third} = \frac{R_{Isolating}}{k}$$

where
  $V_{CS}$ = bandgap reference voltage $V_{BE(Bipolar)}$ = base-to-emitter drop across said bipolar transistor $V_{Isolating}$ = voltage across isolating resistor $V_{BE(Current\ Source)}$ = base-to-emitter drop across said current source transistor $i_L$ = desired current through current source transistor $\beta$ = gain of bipolar or current source transistor $F_0$ = specified fan out $i_{CSLmax}$ = maximum current on $V_{CSL}$ line k = ratio of value of isolating resistor to third resistor.

10. An ECL circuit in accordance with claim 1 wherein said emitter of said current source transistor is connected directly to ground.

11. An ECL circuit in accordance with claim 1 wherein said emitter of said current source transistor is connected through a resistor to ground.

12. An ECL circuit in accordance with claim 1 wherein the operating characteristics of said bipolar transistor will track the operating characteristics of said current source transistor.

13. In an OR/NOR ECL gate circuit utilizing stacked levels of circuitry connected in series across a power supply and including at least two input transistors for each of said stacked levels, a reference voltage transistor and reference voltage supply for each of said stacked levels, a current source transistor whose collector is connected to a first ECL output line, a main current transistor whose collector is connected to the emitters of said transistors in a first one of said stacked levels and whose emitter is connected through a resistor to a potential less than $V_{CC}$, and an emitter follower whose emitter is connected to a second ECL output line and whose base is connected to the collectors of said transistors in a second one of said stacked levels, the improvement comprising:

the base of said current source transistor being connected to a bias voltage, $V_{CSL}$, which is generated by a bias circuit comprising:

a bipolar transistor having its emitter connected to a potential less than a reference supply voltage $V_{CS}$;

a first resistor connected to said reference supply voltage $V_{CS}$;

a second resistor connected between said first resistor and the collector of said bipolar transistor; and a third resistor connected between the base of said bipolar transistor and the interconnection between said first and said second resistors whereby the collector of said bipolar transistor constitutes a supply line supplying said bias voltage, $V_{CSL}$.

14. An improved OR/NOR multiple level ECL gate in accordance with claim 13 in combination with an isolating resistor between said base of said current source transistor and said $V_{CSL}$ supply line.

15. An improved OR/NOR ECL gate in accordance with claim 13 wherein the base of said main current transistor is also connected to said supply line supplying said bias voltage, $V_{CSL}$.

16. An improved OR/NOR gate in accordance with claim 15 in combination with an isolating resistor between said base of said main current transistor and said voltage supply line, supplying said bias voltage, $V_{CSL}$.

* * * * *